United States Patent
Coenegracht et al.

(10) Patent No.: US 9,837,754 B2
(45) Date of Patent: Dec. 5, 2017

(54) SEALING INTERFACE FOR A TELECOMMUNICATIONS ENCLOSURE

(71) Applicant: CommScope Connectivity Belgium BVBA, Kessel-Lo (BE)

(72) Inventors: Philippe Coenegracht, Hasselt (BE); Maddy Nadine Frederickx, Aarschot (BE)

(73) Assignee: CommScope Connectivity Belgium BVBA, Kessel-Lo (BE)

( * ) Notice: Subject to any disclaimer, the term of this patent is extended or adjusted under 35 U.S.C. 154(b) by 0 days.

(21) Appl. No.: 15/217,639

(22) Filed: Jul. 22, 2016

(65) Prior Publication Data
US 2017/0012382 A1 Jan. 12, 2017

Related U.S. Application Data

(63) Continuation of application No. 14/768,067, filed as application No. PCT/EP2014/053174 on Feb. 19, 2014, now Pat. No. 9,423,029.

(60) Provisional application No. 61/766,517, filed on Feb. 19, 2013.

(51) Int. Cl.
| | |
|---|---|
| *H01R 13/52* | (2006.01) |
| *H01R 13/508* | (2006.01) |
| *F16J 15/02* | (2006.01) |
| *H05K 5/00* | (2006.01) |
| *H05K 5/06* | (2006.01) |

(52) U.S. Cl.
CPC ........ *H01R 13/5202* (2013.01); *F16J 15/022* (2013.01); *H01R 13/508* (2013.01); *H05K 5/0095* (2013.01); *H05K 5/061* (2013.01)

(58) Field of Classification Search
CPC .. H01R 13/5202; H01R 13/508; F16J 15/022; H05K 5/0095
See application file for complete search history.

(56) References Cited

U.S. PATENT DOCUMENTS

| | | | | |
|---|---|---|---|---|
| 3,100,502 A | * | 8/1963 | Ford | F16K 17/08 137/469 |
| 3,837,657 A | * | 9/1974 | Farnam | F16J 15/104 277/312 |
| 3,847,423 A | * | 11/1974 | Gley | E05C 19/14 292/113 |
| 4,362,211 A | * | 12/1982 | Fisher, Jr. | E21B 23/02 166/156 |
| 4,424,915 A | * | 1/1984 | Horn | A47J 27/092 220/203.27 |

(Continued)

FOREIGN PATENT DOCUMENTS

| | | |
|---|---|---|
| EP | 1053419 | 4/2003 |
| EP | 2657579 | 10/2013 |

(Continued)

OTHER PUBLICATIONS

International Search Report for International Application No. PCT/EP2014/053174 dated Nov. 6, 2014 (8 pages).

*Primary Examiner* — Peter Radkowski
(74) *Attorney, Agent, or Firm* — Merchant & Gould P.C.

(57) ABSTRACT

A sealing interface (26) that utilizes an elastomeric sealing member (28) is disclosed herein. The sealing interface (26) is configured to provide effective sealing while requiring only relatively low amounts of force to deform the elastomeric sealing member (28) sufficiently to form an effective seal.

20 Claims, 6 Drawing Sheets

(56) References Cited

U.S. PATENT DOCUMENTS

| | | | | |
|---|---|---|---|---|
| 4,850,834 | A * | 7/1989 | Hinson | B29D 30/542 156/394.1 |
| 5,886,850 | A * | 3/1999 | Kaczeus | G06F 13/4081 360/97.21 |
| 5,907,653 | A * | 5/1999 | Burek | G02B 6/3801 385/135 |
| 6,062,073 | A * | 5/2000 | Patton | E21B 23/02 166/100 |
| 6,196,064 | B1 | 3/2001 | Patton | |
| 6,302,200 | B1 | 10/2001 | Patton | |
| 6,481,762 | B1 * | 11/2002 | Rex | F16L 17/025 285/104 |
| 7,193,491 | B2 * | 3/2007 | Leadley-Brown | H01P 11/002 277/603 |
| 7,219,581 | B2 * | 5/2007 | Tulloch | B25B 13/48 279/51 |
| 7,603,018 | B2 * | 10/2009 | Mullaney | G02B 6/4471 174/59 |
| 2004/0180990 | A1 * | 9/2004 | Suzuki | C08K 7/14 523/216 |
| 2006/0214751 | A1 * | 9/2006 | Leadley-Brown | H01P 11/002 333/254 |
| 2006/0220326 | A1 * | 10/2006 | Leadley-Brown | F16J 15/062 277/609 |
| 2007/0034059 | A1 * | 2/2007 | Tulloch | B25B 13/48 81/112 |
| 2008/0170832 | A1 * | 7/2008 | Mullaney | G02B 6/4471 385/135 |

FOREIGN PATENT DOCUMENTS

| | | | |
|---|---|---|---|
| JP | 2001269978 | A * | 10/2001 |
| JP | 2003055569 | A | 2/2003 |
| JP | 2004155855 | A * | 6/2004 |
| JP | 2005339370 | A * | 12/2005 |
| JP | 2008115372 | A * | 5/2008 |
| WO | 9618836 | | 6/1996 |
| WO | 9941531 | | 8/1999 |
| WO | 2012086115 | | 6/2012 |

* cited by examiner

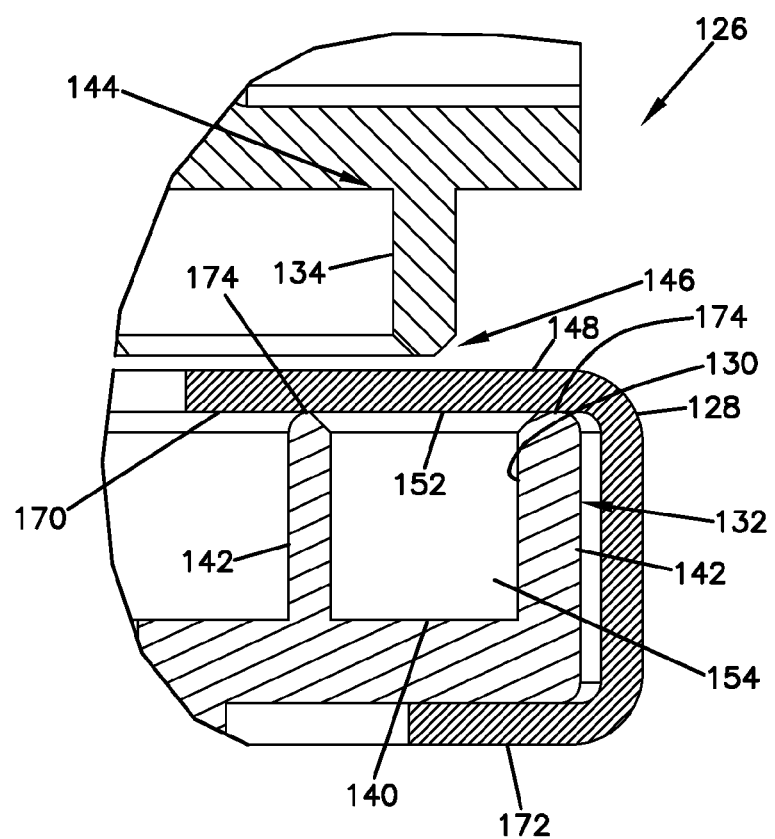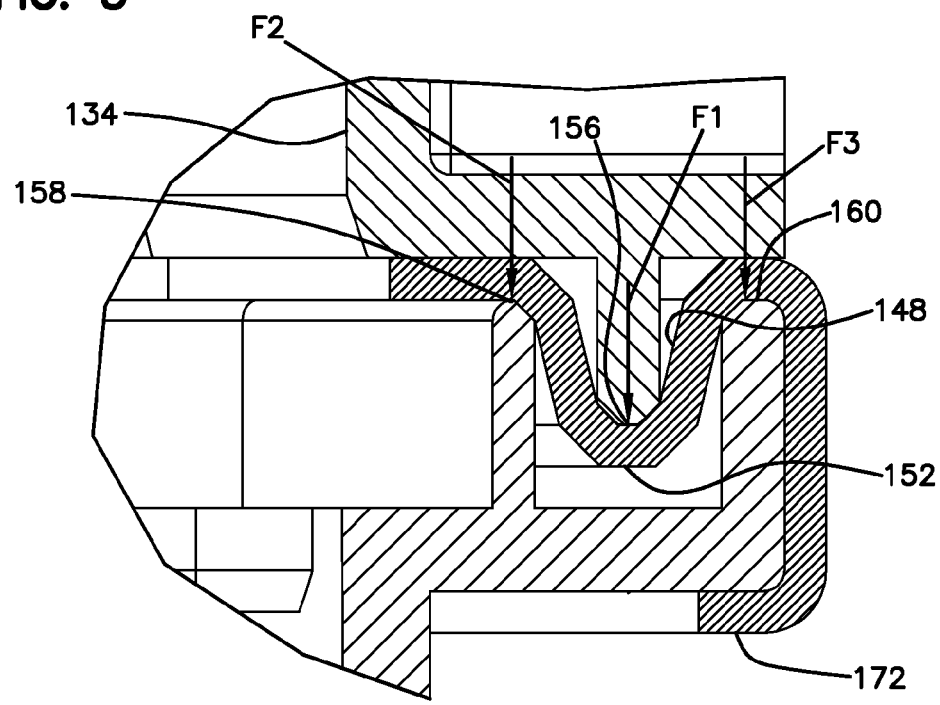

SEALING INTERFACE FOR A TELECOMMUNICATIONS ENCLOSURE

CROSS REFERENCE TO RELATED APPLICATIONS

This application is a Continuation of U.S. application Ser. No. 14/768,067, filed Aug. 14, 2015, now U.S. Pat. No. 9,423,029, issued Aug. 23, 2016, which is a National Stage of PCT/EP2014/053174, filed Feb. 19, 2014, which claims the benefit of U.S. Provisional Application Ser. No. 61/766,517, filed Feb. 19, 2013, and which applications are hereby incorporated by reference in their entireties.

BACKGROUND

Telecommunications networks often use enclosures for containing and protecting telecommunications equipment (e.g., splice locations, optical splitters, multiplexers, connection panels, etc.). Enclosures used in outside environments are desirably sealed to prevent moisture intrusion. Gel seals have worked extremely well for providing perimeter seals between bases and covers of enclosures and for providing seals at any other types of interfaces between the housing pieces of an enclosure. An example gel sealed enclosure is disclosed at U.S. Pat. No. 7,603,018. While gel seals are effective for preventing moisture intrusion, such gel seals typically become less effective after the seals have been disrupted or broken a number of times. Therefore, gel seals are often not used to seal components that are intended to be closed and re-opened many times. Instead, elastomeric seals such as O-ring seals are often used. A problem with O-ring seals is that such seals often require relatively large clamping forces to ensure adequate sealing.

EP 1053419 B1 discloses a sealing interface having a shaped elastomeric sealing member that is used to provide a seal between two housing pieces. In use, the elastomeric sealing member forms radial seals within a channel of one of the housing pieces. A problem with this type of design is that a relatively large force is required to press the elastomeric sealing member within its corresponding channel to form the radial seals.

SUMMARY

One aspect of the present disclosure relates to a sealing interface that utilizes an elastomeric sealing member. The sealing interface is configured to provide effective sealing while requiring only relatively low amounts of force to deform the elastomeric sealing member sufficiently to form an effective seal. In one example, the elastomeric sealing member undergoes a trampoline effect when deformed to a sealing configuration. In one example, a first axial seal location is provided at a first side of the elastomeric sealing member and second and third axial seal locations are provided at a second side of the elastomeric sealing member. In certain examples, the first axial seal location is positioned on an axial reference line that intersects a void region, and the second and third axial seal locations are positioned on opposite sides of the axial reference line.

Another aspect of the present disclosure relates to a sealing interface between two housing pieces that includes an elastomeric sealing member having an H-shaped transverse cross-sectional profile.

A further aspect of the present disclosure relates to a sealing interface between two housing pieces that includes an elastomeric sealing member having a sheet-like construction.

Still another aspect of the present disclosure relates to an enclosure for telecommunications equipment. The enclosure includes first and second housing pieces that fit together to form at least a portion of the enclosure. The first and second housing pieces meet at a sealing interface. The sealing interface includes a sealing channel section of the first housing piece and a sealing rib of the second housing piece. The sealing channel section defines a sealing channel. The sealing rib projects into the sealing channel when the first and second housing pieces are fitted together. The sealing interface includes an elastomeric sealing member having a first side that faces away from a closed end of the sealing channel and a second side that faces toward the closed end of the sealing channel. The sealing interface also includes a void region defined between the second side of the elastomeric sealing member and the closed end of the sealing channel. The sealing rib has a base end and a free end. The free end of the sealing rib engages the first side of the elastomeric sealing member to form a first axial seal location when the first and second housing pieces are fitted together. The sealing channel section engages the second side of the elastomeric sealing member to form second and third axial seal locations when the first and second housing pieces are fitted together. The first axial seal location is positioned on an axial reference line that intersects the void region. The axial reference line is positioned between the second and third axial seal locations.

A further aspect of the present disclosure relates to an enclosure having first and second pieces that fit together to form at least a portion of the enclosure. The first and second pieces meet at a sealing interface. The sealing interface includes a sealing channel of the first housing piece and a sealing rib of the second housing piece. The sealing rib projects into the sealing channel when the first and second housing pieces are fitted together. The sealing interface includes an elastomeric sealing member positioned at the sealing channel. The elastomeric sealing member has an H-shaped transverse cross-sectional profile. The H-shaped transverse cross-sectional profile includes two space-apart legs interconnected by a cross-member. The sealing rib engages the cross-member when the first and second housing pieces are fitted together.

Still another aspect of the present disclosure relates to an enclosure having first and second housing pieces that fit together to form at least a portion of the enclosure. The first and second housing pieces meet at a sealing interface. The sealing interface includes a sealing channel of the first housing piece and a sealing rib of the second housing piece. The sealing rib projects into the sealing channel when the first and second housing pieces are fitted together. The sealing interface includes an elastomeric sealing member in the form of an elastic sheet that extends across the sealing channel and is pressed into the sealing channel by the sealing rib when the first and second housing pieces are fitted together.

A variety of additional aspects will be set forth in the description that follows. The aspects relate to individual features and to combinations of features. It is to be understood that both the forgoing general description and the following detailed description are exemplary and explanatory only and are not restrictive of the broad inventive concepts upon which the examples disclosed herein are based.

BRIEF DESCRIPTION OF THE DRAWINGS

FIG. 4 is a cross-sectional view showing another sealing interface suitable for use with the telecommunications enclosure of FIG. 1, the sealing interface is shown in a non-sealing state;

FIG. 5 is a cross-sectional view showing the sealing interface of FIG. 4 in a sealing state;

DETAILED DESCRIPTION

Figure 1:
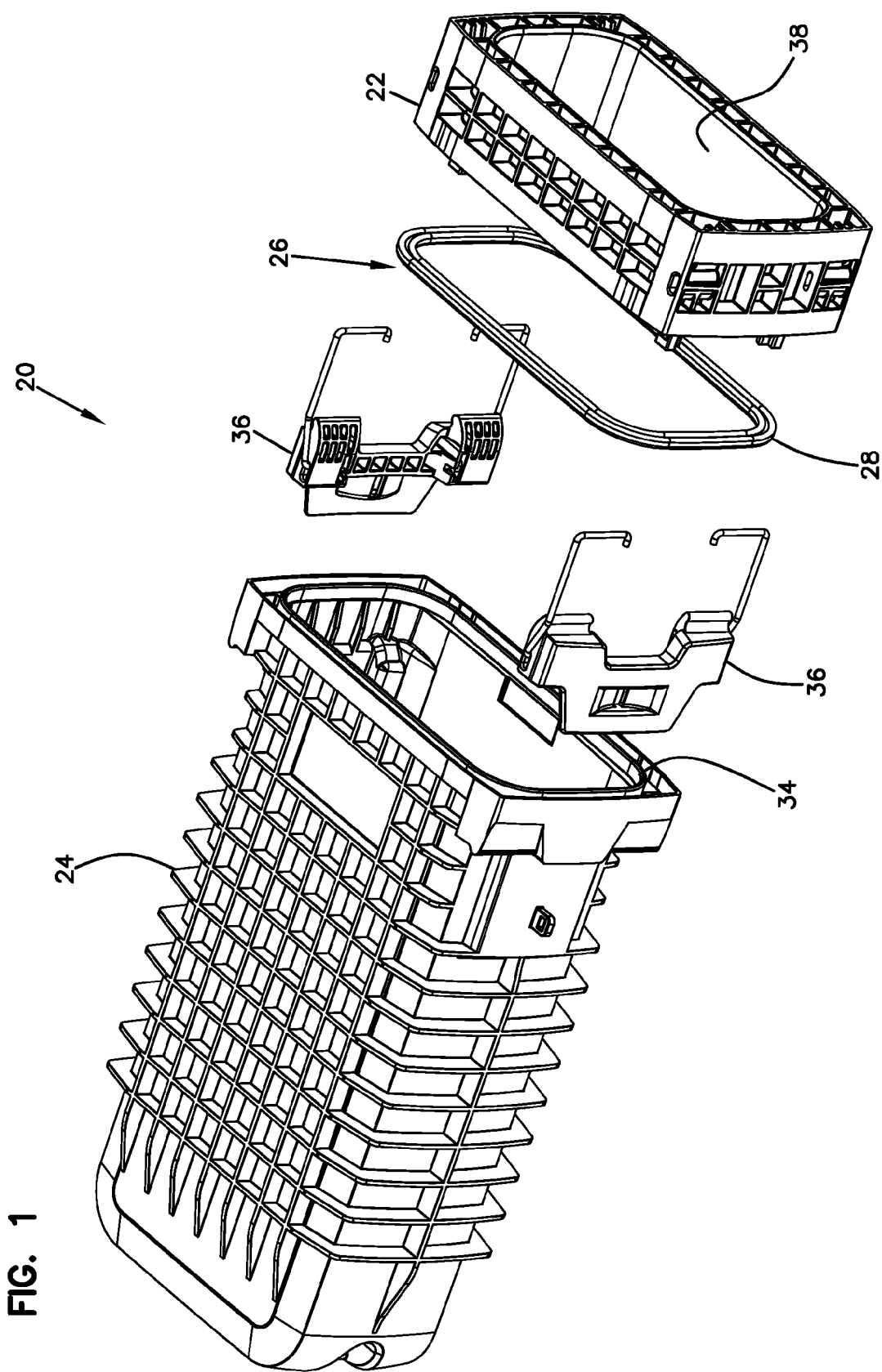
FIG. 1 is an exploded view of a telecommunications enclosure in accordance with the principles of the present disclosure.

FIG. 1 illustrates a telecommunications enclosure 20 in accordance with the principles of the present disclosure. The telecommunications enclosure 20 includes first and second housing pieces 22, 24 that fit together to form the telecommunications enclosure 20. The first housing piece 22 is depicted as a base and the second housing piece 24 is depicted as a dome. The first and second housing pieces 22, 24 meet at a sealing interface 26 that forms a perimeter seal between the first and second housing pieces 22, 24 when the first and second housing pieces 22, 24 are fitted together. The sealing interface 26 includes an elastomeric sealing member 28 arranged in a continuous loop. The elastomeric sealing member 28 fits within a sealing channel 30 defined by a sealing channel section 32 (see FIGS. 2 and 3) of the first housing piece 22. The second housing piece 24 includes a sealing rib 34 that projects into the sealing channel 30 and engages the elastomeric sealing member 28 when the first and second housing pieces 22, 24 are fitted together. The telecommunications enclosure 20 further includes latches 36 mounted at opposite sides of the housing for latching the first and second housing pieces 22, 24 together. The latches 36 hold the first and second housing pieces 22, 24 together with sufficient force to effectively seal the sealing interface 26.

The second housing piece 24 is adapted to contain telecommunications components such as splice trays, optical power splitters, wave length division multiplexers, fiber managers, slack fiber storage devices and other components. The first housing piece 22 includes a central opening 38 adapted for receiving a sealing block (not shown) that can be pressurized within the central opening 38. Typically, cables such as fiber optic cables can be routed into the telecommunications enclosure 20 through a sealing block positioned in the central opening 38. The sealing block provides environmental seals around the telecommunications cables and also provides a peripheral seal with the interior of the first housing piece 22. The telecommunications enclosure 20 is a re-enterable enclosure whereby the second housing piece 24 can be readily disconnected from the first housing piece 22 by unlatching the latches 36. Because the telecommunications enclosure 20 is readily re-enterable, telecommunications equipment within the telecommunications enclosure 20 can be easily accessed for servicing, maintenance, repair or upgrades.

While the first housing piece 22 has been depicted as a base and the second housing piece 24 has been depicted as a dome, it will be appreciated that the housing pieces can have many different types of configurations. For example, the housing pieces can include housing bodies with pivotal side covers, end covers or other type of cover arrangement. Aspects of the present disclosure are applicable to any type of enclosure having housing pieces that fit together and require sealing.

The aspects of the present disclosure relate to sealing arrangements that can provide effective sealing at low forces. By utilizing low forces, the securement arrangement used to secure the first and second housing pieces 22, 24 together can be made less robust (e.g., latches can be made smaller or a smaller number of latches can be reduced). Sealing arrangements in accordance with the principles of the present disclosure are preferably suited for use with re-enterable enclosures. Therefore, it is desirable for the sealing arrangements to be able to be opened and closed many times without losing the ability to provide effective sealing.

Figure 2:
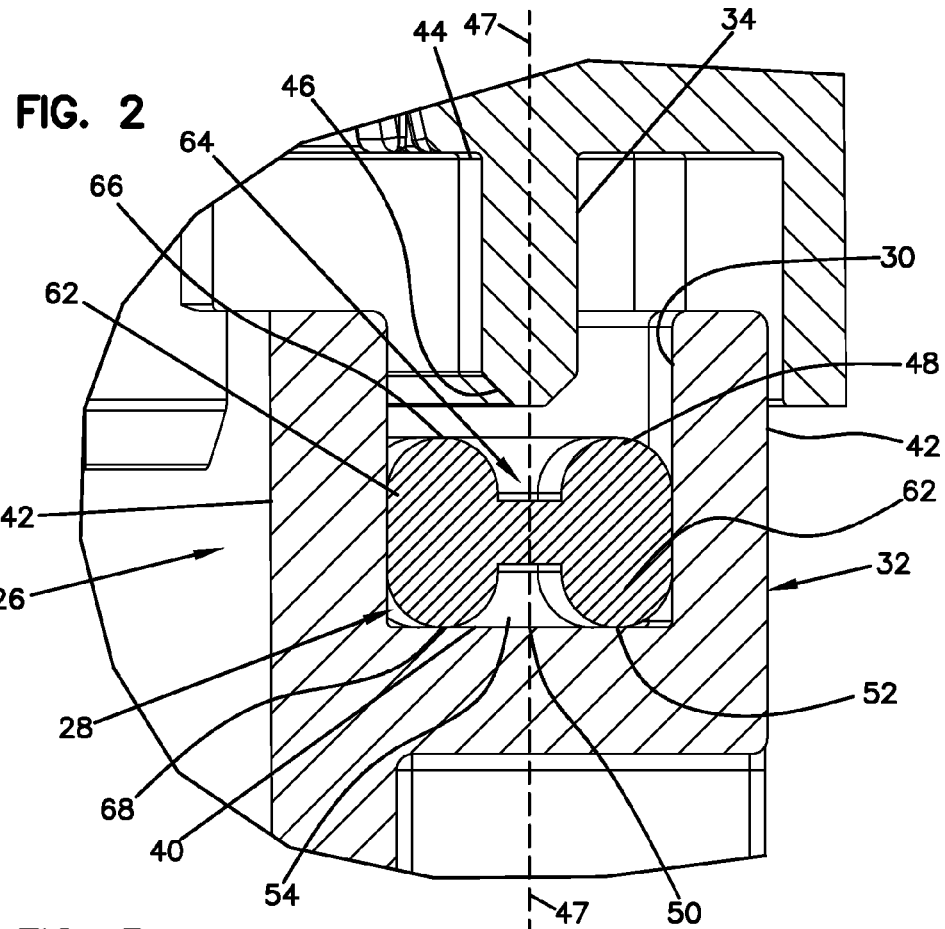
FIG. 2 is a cross-sectional view of an example sealing interface suitable for use with the telecommunications enclosure of FIG. 1, the sealing interface is shown in a non-sealing state.
Figure 3:
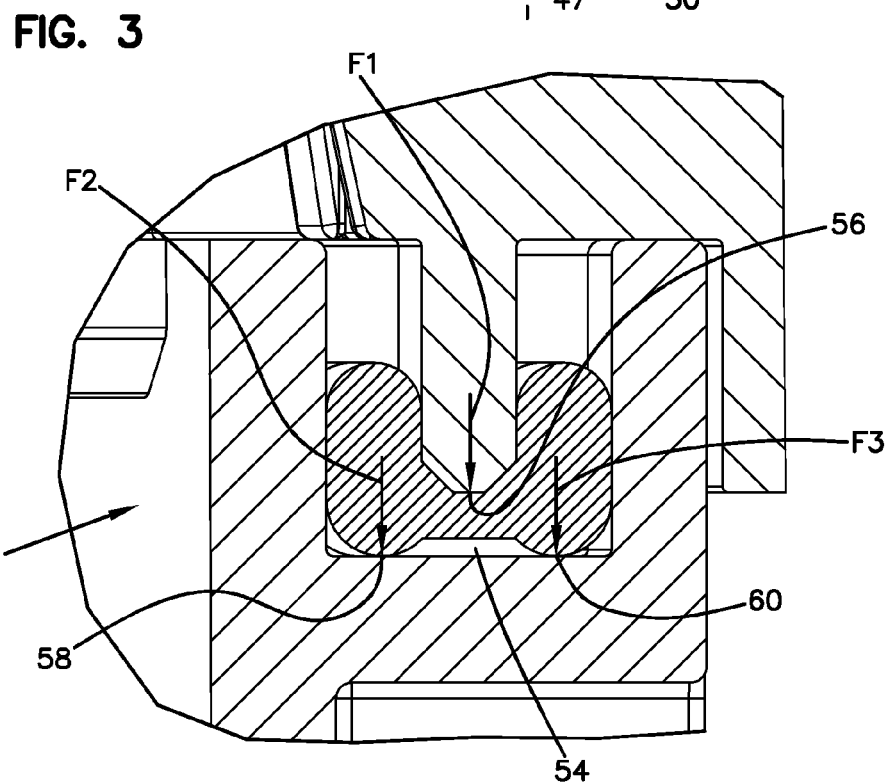
FIG. 3 is a cross-sectional view showing the sealing interface of FIG. 2 in a sealing state.

As shown at FIGS. 2 and 3, the sealing channel section 32 is integral with a main body of the first housing piece 22 and includes a channel base 40 and two space-apart channel ribs 42 that project from the channel base 40. The channel base 40 and the channel ribs 42 cooperate to define the sealing channel 30. As depicted at FIGS. 2 and 3, the channel ribs 42 project upwardly from the channel base 40.

The sealing rib 34 is carried with the second housing piece 24 and includes a base end 44 and a free end 46. The base end 44 of the sealing rib 34 is integral with a main body of the second housing piece 24. The sealing rib 34 projects downwardly from the main body of the second housing piece 24. In this way, the sealing rib 34 extends from the main body of the second housing piece 24 toward the sealing channel 30. As shown at FIG. 2, an axial reference line 47 bisects the sealing rib 34 and extends through the sealing rib 34 from the base end 44 to the free end 46.

The elastomeric sealing member 28 has an elastic construction and can be made of a rubber or rubber-like material. In one example, the elastomeric sealing member 28 includes a silicone rubber material. Other materials having comparable elastomeric characteristics can be used as well. The elastomeric sealing member 28 has a first side 48 that faces away from a closed end 50 of the sealing channel 30 and a second side 52 that faces toward the closed end 50 of the sealing channel 30. The sealing interface 26 includes a void region 54 defined between the second side 52 of the elastomeric sealing member 28 and the closed end 50 of the sealing channel 30.

When the first and second housing pieces 22, 24 are fitted together, the free end 46 of the sealing rib 34 engages the first side 48 of the elastomeric sealing member 28 to form a first axial seal location 56 (see FIG. 3) and the second side 52 of the elastomeric sealing member engages the channel base 40 to form second and third axial seal locations 58, 60 (see FIG. 3). The first axial seal location 56 is positioned on the axial reference line 47 that bisects the sealing rib 34. The axial reference line 47 is positioned between the second and third axial seal locations 58, 60.

As used herein, an axial direction is defined as the direction of movement between the sealing rib 34 and the sealing channel 30 as the first and second housing pieces 22, 24 are fitted together. As depicted in FIG. 2, the axial reference line 47 extends in the axial direction. As used herein, axial seal locations are sealing locations formed by a force having at least a component that extends in the axial direction. The axial sealing forces have at least components that extend in the axial direction. In certain examples, the force component extending in the axial direction represents a majority of the total magnitude of the sealing force. In certain examples, the axial sealing forces are purely axial in direction such that the entire magnitudes of the forces extend in the axial direction. As shown at FIG. 3, the first, second and third axial seal locations 56, 58 and 60 correspond to axial sealing forces F1, F2, and F3. The axial seal in force F1 is the seal force applied to the first side 48 of the elastomeric sealing member 28 by the free end 46 of the sealing rib 34. The axial sealing forces F2 and F3 are the axial sealing forces applied by the second side 52 of the elastomeric sealing member 28 to the channel base 40. When the sealing interface 26 is fully sealed, the void region 54 is maintained between the second and third axial seal locations 58, 60 in axial alignment with the first axial seal location 56.

Referring to FIG. 2, the elastomeric sealing member 28 has an H-shaped transverse cross-sectional profile that includes two spaced-apart legs 62 interconnected by a cross-member 64. The legs 62 have rounded upper ends 66 and rounded lower ends 68. The free end 46 of the sealing rib 34 engages the top side of the cross-member 64 to provide the first axial seal location 56. The rounded lower ends 68 of the legs 62 engage the channel base 40 to provide the second and third axial seal locations 58, 60. Once the sealing interface 26 has been fully sealed, the elastomeric sealing member 28 has a generally U-shaped transverse cross-sectional profile (see FIG. 3).

When the sealing rib 34 engages the top side of the cross-member 64, the cross-member 64 can flex downwardly toward the void region 54 similar to a trampoline. In this way, since the cross-member 64 is not being pressed directly against another solid surface, a relatively small force can be used to flex the cross-member 64 to form the first axial seal location 56. As the force F1 is applied by the sealing rib 34 to the cross-member 64, the forces F2, F3 are transferred through the elastomeric sealing member 28 to the rounded lower ends 68 of the legs 62. In this way, the second and third axial seal locations 58, 60 are provided at the rounded lower ends 68 of the legs 62.

FIGS. 4 and 5 show an alternative sealing interface 126 that can be used with the telecommunications enclosure 20. The sealing interface 126 includes a sealing rib 134 having a base end 144 and a free end 146. The sealing interface 126 also includes a sealing channel structure 132 defining a sealing channel 130. The sealing channel structure 132 includes a channel base 140 and channel ribs 142. The sealing interface 126 further includes an elastomeric sealing member 128 having an elastic, sheet-like construction. The elastomeric sealing member 128 has a fixed end 170 that is fixed relative to the sealing channel structure 132 and a movable end 172 that is movable relative to the sealing channel structure 132. In a non-sealing configuration, the elastomeric sealing member 128 is generally planar and bridges the sealing channel 130 without extending into the sealing channel 130. Thus, the elastomeric sealing member 128 extends across top ends 174 of the channel ribs 142.

To provide a seal at the sealing interface 126, the sealing rib 134 is pressed downwardly into the sealing channel 130. As the sealing rib 134 is pushed into the sealing channel 130, the sealing rib 134 engages a first side 148 of the elastomeric sealing member 128 thereby causing the elastomeric sealing member 128 to flex or deflect elastically downwardly into the sealing channel 130 so as to form a U-shaped transverse cross-sectional profile (see FIG. 5). As the elastomeric sealing member 128 is pressed into the sealing channel 130, the movable end 172 of the elastomeric sealing member 128 can slide relative to the sealing channel structure 132 to provide extra sealing member length for accommodating movement of the elastomeric sealing member 128 into the sealing channel 130. A void region 154 is defined between a second side 152 of the elastomeric sealing member 128 and the channel base 140. The void region 154 exists before and after sealing. The presence of the void region 154 allows the elastomeric sealing member 128 to flex like a trampoline to accommodate the sealing rib 134. In this way, a relatively low amount of force is required to move the sealing rib 134 from the non-sealing position of FIG. 4 to the sealing position of FIG. 5.

In the sealing position of FIG. 5, a first axial seal location 156 is formed between the free end 146 of the sealing rib 134 and the first side 148 of the elastomeric sealing member 128. Also, second and third axial seal locations 158, 160 are defined between the second side 152 of the elastomeric sealing member 128 and the top ends 174 of the channel ribs 142. Axial sealing forces F1, F2 and F3 respectively correspond to the first, second and third axial seal locations 156, 158 and 160. All of the axial sealing forces F1, F2 and F3 have an axial force component.

Figure 6:
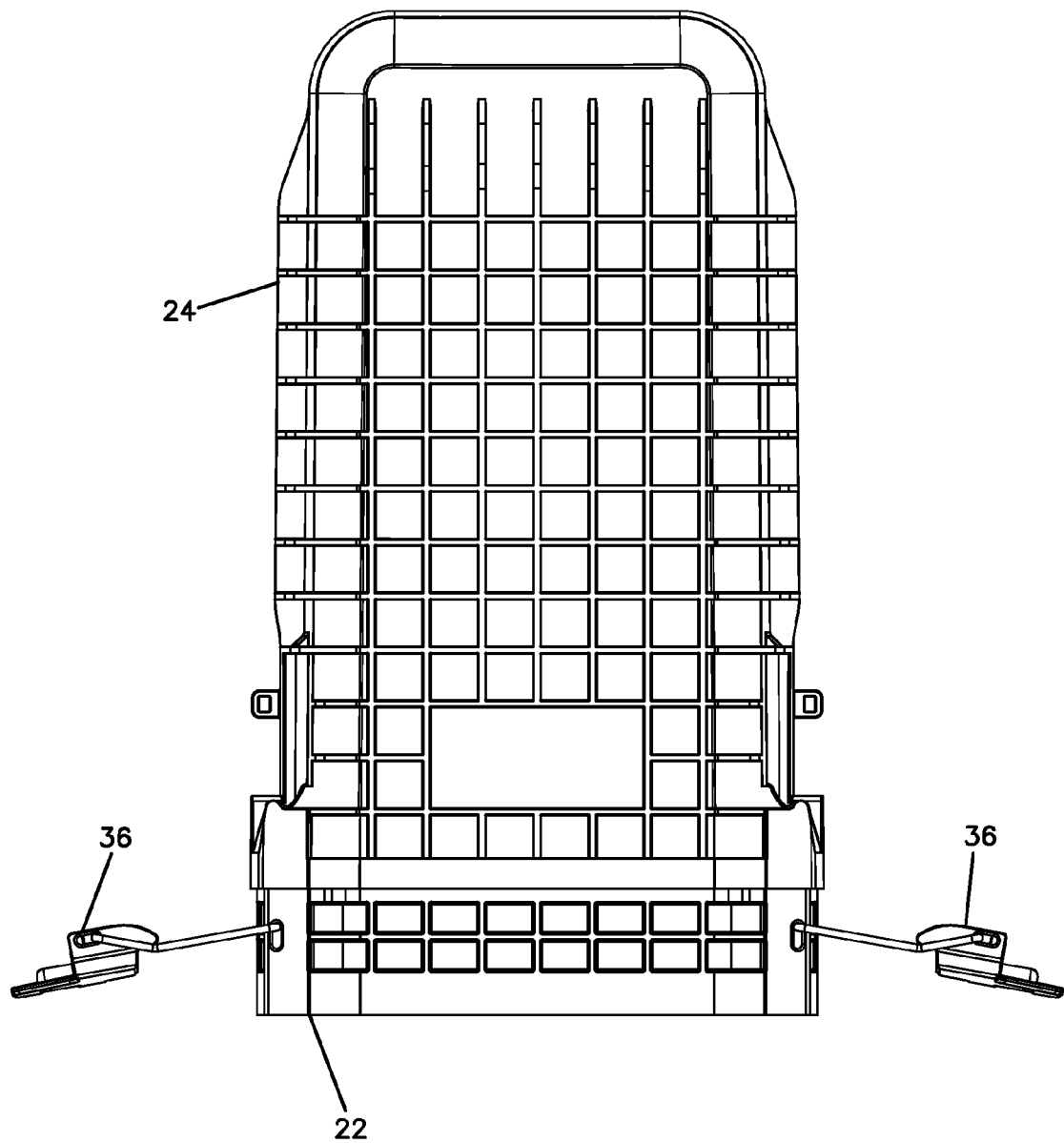
FIG. 6 shows the telecommunications enclosure of FIG. 1 in a non-latched (i.e., open) configuration.
Figure 7:
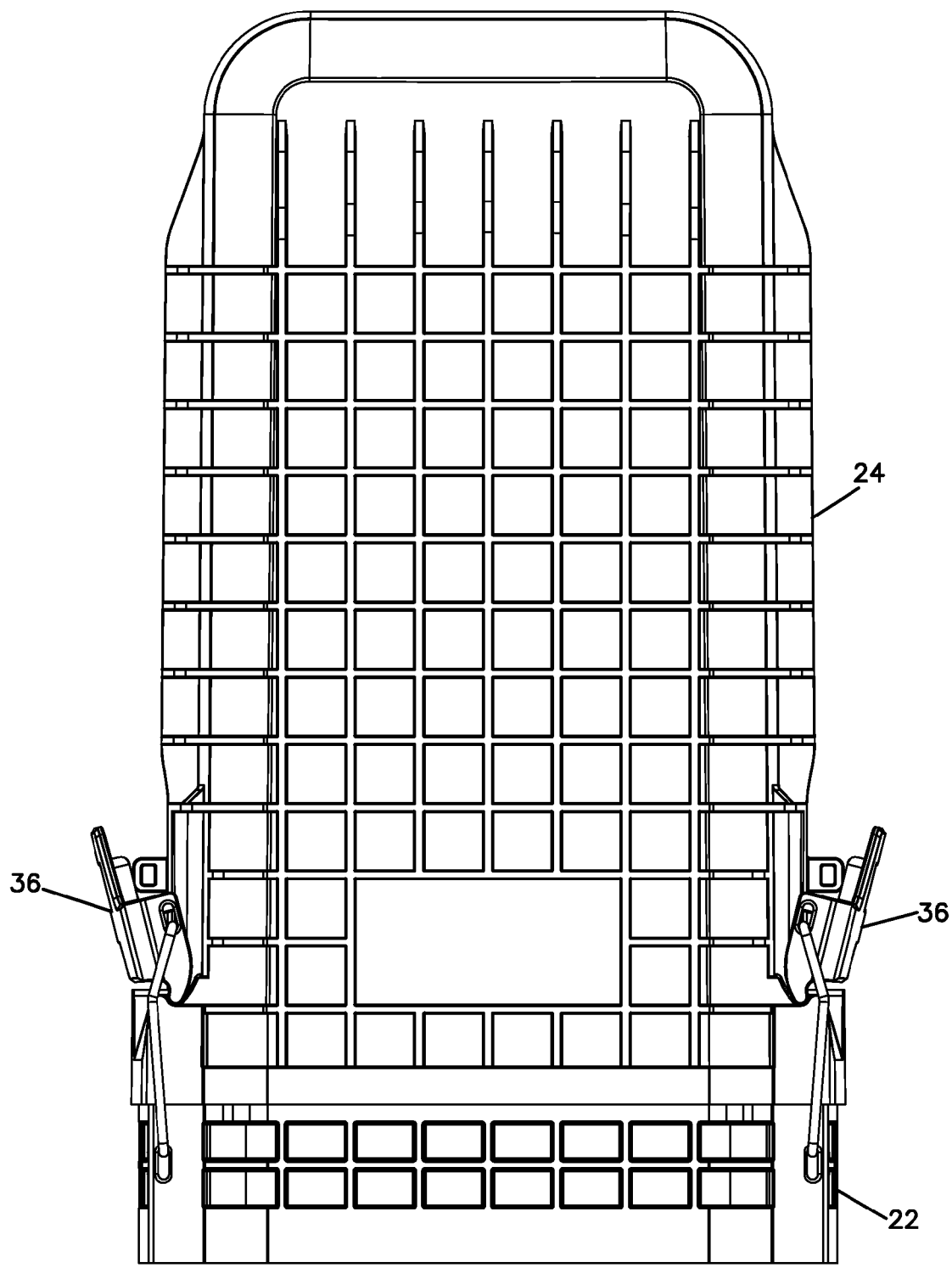
FIG. 7 shows the telecommunications enclosure of FIG. 1 in a partially latched position.
Figure 8:
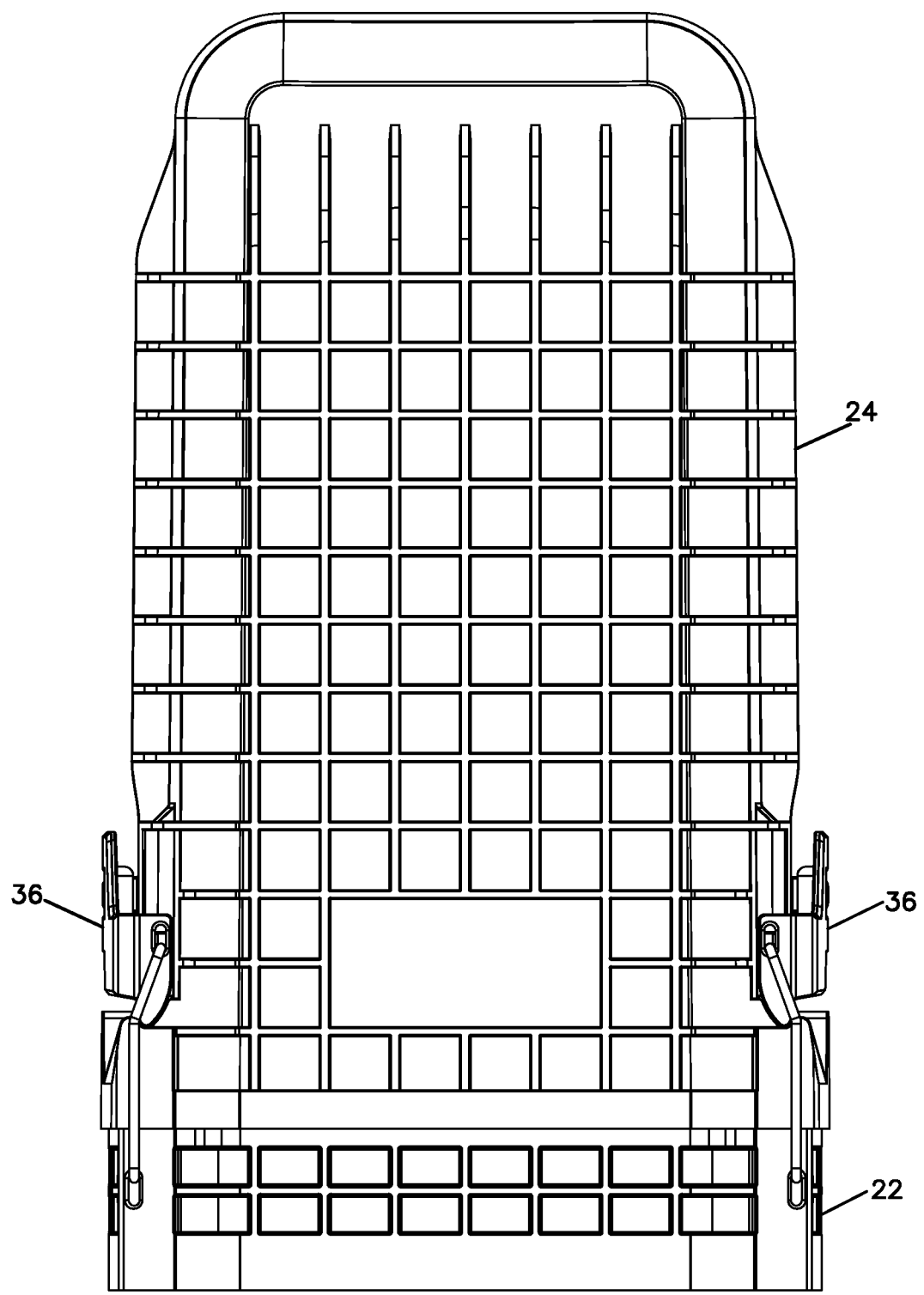
FIG. 8 shows the telecommunications enclosure of FIG. 1 in a fully latched position.

Referring to FIGS. 6-8, the latches 36 are configured to ensure uniform pressure is applied to the sealing interface during latching. In this way, the second housing piece 24 is prevented from pivoting or canting excessively relative to the first housing piece 22 during latching. Each of the latches 36 has an open position (see FIG. 6), a partially latched position (see FIG. 7) and a fully latched position (see FIG. 8). The latches have an intermediate over-the-center latching configuration that holds the latches at the partial latching position and a final over-the-center latching configuration that holds the latches in the fully latched position. Canting of the second housing piece 24 relative to the first housing piece 22 is prevented by moving both of the latches to the partial latching position before moving the latches to the fully latched position.

The elastomeric sealing member 128 can be manufactured from relatively soft materials having relatively low durometer hardness values. In one example, the elastomeric sealing member 128 can have a durometer hardness of between 15-45 Shore A. In other examples, the elastomeric sealing member 128 can have a durometer hardness of between about 20-40 Shore A. In certain examples, the elastomeric sealing member 128 can have a durometer hardness of between about 20-30 Shore A.

The configuration of the elastomeric sealing member 128 can allow the enclosure to be effectively sealed without requiring large clamping forces. In the depicted example, only two latches 36 on opposite sides of the telecommunications enclosure 20 can be used to effectively compress the seal about the entire sealing perimeter of the housing. The two latches 36 can latch and seal the second housing piece 24 to the first housing piece 22 with minimal force because of the low durometer hardness value of the elastomeric sealing member 128 and the configuration of the seal. In other words, the latches 36 can be actuated with a relatively low latching force. Although only two latches 36 are shown, it is understood that in other examples more than two of the latches 36 can be used. In certain examples, the durometer hardness values of the elastomeric sealing member 128 can be greater than 45 Shore A.

In one example, the amount of force to deform the elastomeric sealing member 128 is minimal such that the elastomeric sealing member 128 extends across the sealing channel 30 and is pressed into the sealing channel 30 by the sealing rib 34 when the first and second housing pieces 22, 24 are fitted together. The travel distance measured to deform the elastomeric sealing member 128 is, for example, about at least 2 mm. In one example, the travel distance is measured from an initial point of contact with the elastomeric sealing member 128. In certain examples, the travel distance of about at least 2 mm can increase manufacturing tolerances.

From the forgoing detailed description, it will be evident that modifications and variations can be made without departing from the spirit or scope of the invention.

LIST OF REFERENCE NUMERALS AND CORRESPONDING FEATURES

20 telecommunications enclosure
22 first housing piece
24 second housing piece
26 sealing interface
28 elastomeric sealing member
30 sealing channel
32 sealing channel section
34 sealing rib
36 latches
38 central opening
40 channel base
42 channel ribs
44 base end
46 free end
47 axial reference line
48 first side
50 closed end
52 second side
54 void region
56 first axial seal location
58 second axial seal location
60 third axial seal location
62 legs
64 cross-member
66 rounded upper ends
68 rounded lower ends
126 sealing interface
128 elastomeric sealing member
130 sealing channel
132 sealing channel structure
134 sealing rib
140 channel base
142 channel ribs
144 base end
146 free end
148 first side
152 second side
154 void region
156 first axial seal location
158 second axial seal location
160 third axial seal location
170 fixed end
172 movable end
174 top ends
F1, F2, F3 axial sealing forces

What is claimed is:

1. An enclosure for telecommunications equipment comprising:
    first and second housing pieces that fit together to form at least a portion of the enclosure, the first and second housing pieces meeting at a sealing interface, the sealing interface including a sealing channel section of the first housing piece and a sealing rib of the second housing piece, the sealing channel section defining a sealing channel, the sealing channel section including a channel base and channel ribs, the sealing rib projecting into the sealing channel when the first and second housing pieces are fitted together;
    the sealing interface including an elastomeric sealing member having a fixed end that is fixed relative to the sealing channel structure, and a movable end that is movable relative to the sealing channel structure, the elastomeric sealing member extending across top ends of the channel ribs while in a non-sealing configuration;
    the sealing rib having a base end and a free end, the free end of the sealing rib engaging a first side of the elastomeric sealing member to form a first axial seal location when the first and second housing pieces are fitted together, the top ends of the channel ribs engaging the second side of the elastomeric sealing member, second and third axial seal locations being defined between the top ends of the channel ribs and the second side of the elastomeric sealing member when the first and second housing pieces are fitted together; and
    the sealing interface including a void region defined between the second side of the elastomeric sealing member and the channel base of the sealing channel section.

2. The enclosure of claim 1, wherein the elastomeric sealing member bridges the sealing channel without extending into the sealing channel.

3. The enclosure of claim 1, wherein the elastomeric sealing member is generally planar.

4. The enclosure of claim 1, wherein the elastomeric sealing member has an elastic, sheet-like construction.

5. The enclosure of claim 1, wherein as the free end of the sealing rib engages the first side of the elastomeric sealing member, the elastomeric sealing member deflects elastically downwardly into the sealing channel so as to form a U-shaped transverse cross-sectional profile.

6. The enclosure of claim 5, wherein as the elastomeric sealing member is pressed into the sealing channel, the movable end of the elastomeric sealing member slides relative to the sealing channel section to provide extra sealing member length for accommodating movement of the elastomeric sealing member into the sealing channel.

7. The enclosure of claim 1, wherein the void region exists before and after sealing of the first and second housing pieces together.

8. The enclosure of claim 1, wherein the first housing piece includes a base and the second housing piece includes a dome, and wherein the sealing interface forms a perimeter seal between the base and the dome.

9. The enclosure of claim 8, wherein the base is secured to the dome by first and second latches positioned on opposite sides of the base, the first and second latches each having an open position, an intermediate over-the-center position, and a final over-the-center position.

10. The enclosure of claim 1, wherein the first and second housing pieces are secured together by a securement arrangement selected from the group consisting of latches, fasteners and clamps.

11. The enclosure of claim 1, wherein the elastomeric sealing member is a rubber material.

12. The enclosure of claim 1, wherein the elastomeric sealing member is silicone rubber.

13. The enclosure of claim 1, wherein the elastomeric sealing member is a rubber-like material.

14. The enclosure of claim 1, wherein the channel ribs project outwardly from the channel base of the sealing channel section.

15. An enclosure for telecommunications equipment comprising:
first and second housing pieces that fit together to form at least a portion of the enclosure, the first and second housing pieces meeting at a sealing interface, the sealing interface including a sealing channel of the first housing piece and a sealing rib of the second housing piece, the sealing channel including a channel base and channel ribs, the sealing rib projecting into the sealing channel when the first and second housing pieces are fitted together; and
the sealing interface including an elastomeric sealing member having a fixed end that is fixed relative to the sealing channel, and a movable end that is movable relative to the sealing channel, the elastomeric sealing member extending across top ends of the channel ribs while in a non-sealing configuration, the sealing interface including a void region defined between the elastomeric sealing member and the channel base of the sealing channel.

16. An enclosure for telecommunications equipment comprising:
first and second housing pieces that fit together to form at least a portion of the enclosure, the first and second housing pieces meeting at a sealing interface, the sealing interface including a sealing channel of the first housing piece and a sealing rib of the second housing piece;
the sealing interface including an elastomeric sealing member that is pressed into the sealing channel by the sealing rib when the first and second housing pieces are fitted together, the elastomeric sealing member forming a U-shaped transverse cross-sectional profile; and
the sealing channel defining a void region between the second side of the elastomeric sealing member and the sealing channel when the first and second housing pieces are fitted together.

17. The enclosure of claim 16, wherein the elastomeric sealing member is an elastic sheet.

18. The enclosure of claim 17, wherein the elastic sheet bridges an open end of the sealing channel without extending into the sealing channel when the first and second housing pieces are not fitted together.

19. The enclosure of claim 18, wherein the elastic sheet includes a fixed end and a moveable end, and wherein the movable end moves when the sealing rib presses the elastic sheet into the sealing channel.

20. The enclosure of claim 19, wherein the sealing channel includes first and second spaced-apart channel ribs that project outwardly from the sealing channel, wherein the sealing rib engages a first side of the elastomeric sealing member to provide a first axial seal location, and wherein top ends of the first and second spaced-apart channel ribs engage second side locations of the elastomeric sealing member to form second and third axial seal locations.

* * * * *